US005428839A

United States Patent [19]
Friesen et al.

[11] Patent Number: 5,428,839
[45] Date of Patent: Jun. 27, 1995

[54] PLANAR MAGIC-TEE DOUBLE BALANCED MIXER

[75] Inventors: Michael J. Friesen, Phoenix; Benny W. Lowe, Queen Creek, both of Ariz.

[73] Assignee: Motorola, Inc., Schaumburg, Ill.

[21] Appl. No.: 116,744

[22] Filed: Sep. 7, 1993

[51] Int. Cl.⁶ .......................... H04B 1/26; H01P 5/20
[52] U.S. Cl. .................................. 455/326; 455/330; 455/333; 333/121
[58] Field of Search ...................... 455/323, 325–327, 455/330, 333; 333/117, 118, 121

[56] References Cited

U.S. PATENT DOCUMENTS

| | | | |
|---|---|---|---|
| 4,578,652 | 3/1986 | Sterns | 333/121 X |
| 4,603,435 | 7/1986 | Butler | 455/319 |
| 4,675,911 | 6/1987 | Sokolov et al. | 455/325 |
| 4,978,933 | 12/1990 | Marconi | 333/117 |
| 4,992,761 | 2/1991 | Seely et al. | 333/118 |
| 5,006,811 | 4/1991 | Kruger | 329/354 |
| 5,023,576 | 6/1991 | Staudinger et al. | 333/118 |
| 5,045,821 | 9/1991 | Staudinger et al. | 333/118 |
| 5,063,365 | 11/1991 | Cappucci | 333/121 |
| 5,142,697 | 8/1992 | Podvin | 455/326 |
| 5,303,418 | 4/1994 | Staudinger et al. | 455/326 |

FOREIGN PATENT DOCUMENTS 59-86314  5/1984  Japan .................... 455/326

OTHER PUBLICATIONS

Ogawa et al, "K-Band Integrated Double-Balanced Mixer", IEEE Transactions on Microwave Theory & Techniques, vol. MTT-28, No. 3, Mar. 1980.
"Double-Arrow 180° Hybrid Covers 1 to 18 GHz" by Krytar, Sunnyvale, Calif. from Microwave Journal, Mar. 1987.

*Primary Examiner*—Reinhard J. Eisenzopf
*Assistant Examiner*—Chi H. Pham
*Attorney, Agent, or Firm*—Gregory J. Gorrie

[57] ABSTRACT

A broad bandwidth double balanced mixer with all circuitry contained on a single MMIC die is disclosed using planar magic tee hybrids to greatly reduce component quantity and die area. The hybrids comprise a Lange coupler followed by a capacitor and a quarter-wavelength transmission line on the direct path, in conjunction with a half-wavelength transmission line on the coupled path. The hybrid is essentially a planar realization of a magic tee, producing two equal magnitude outputs that are substantially 180 degrees separated in phase, with the coupled input terminated in 50 ohms. The mixer topology is a ring configured diode quad with two magic tee's at the RF and LO ports and a Wilkinson power divider at the IF port.

25 Claims, 3 Drawing Sheets

PLANAR MAGIC-TEE DOUBLE BALANCED MIXER

FIELD OF THE INVENTION

The present invention relates in general to electronic circuits know as mixers, in particular to double-balanced mixers and more particularly to microwave integrated mixers.

BACKGROUND OF THE INVENTION

It is commonplace in the electronic art to combine a modulated or modulating signal with a local oscillator signal in order to obtain a further modulated signal at another frequency that is more easily amplified, filtered, broadcast, and/or detected. This is done in a mixer.

In a typical demodulation application, a modulated radio frequency (RF) signal is combined in a mixer with a local oscillator (LO) signal to produce an intermediate frequency (IF) signal which may be then further amplified and detected to recover the information modulated onto the RF carrier. Alternatively, this process can be reversed, mixing an LO signal with an IF signal to produce a modulated carrier (RF) signal for further amplification and ultimate transmission as a modulated output signal.

The demodulation mixing process produces sum and differences of the RF and LO frequencies. One or more of the sum and difference frequencies is at the desired IF frequency, according to the following relations:

(1) $f_{IF} = f_{LO} - f_{RF}$, i.e., down conversion where $f_{LO} > f_{RF}$, (2) $f_{IF} = f_{RF} - f_{LO}$, i.e., down conversion where $f_{LO} < f_{RF}$, (3) $f_{IF} = f_{LO} + f_{RF}$, i.e., up conversion.

Similar relations apply to modulation of a carrier signal.

Examination of equations (1) and (2) shows that there is not a unique correspondence between $f_{LO}$, $f_{IF}$, and $f_{RF}$. For a given value of $f_{LO}$, two different values of $f_{RF}$ may produce the same value of $f_{IF}$. For example, (see FIG. 1) for $f_{LO} = 3$ GigaHertz, both $f_{RF1} = 2.5$ GigaHertz and $f_{RF2} = 3.5$ GigaHertz can produce $f_{IF} = 0.5$ GigaHertz. The RF and IF frequencies are generally not discrete frequencies but narrow frequency bands determined by the modulation thereon. The LO frequency is typically sharply defined, but may be time varying in some cases.

A prior art double balanced mixer apparatus 10 is illustrated in FIG. 2. Mixer apparatus 10 comprises input 12, input 42, output 15, balun transformers 16, 17, and four port mixer element 19 comprising diodes 24, 25, 27, 29, and having input ports 9, 23, 26, 28. RF input signal 14 comprising either or both RF1 and RF2 (FIG. 1) enters at RF port 12. Balun transformer 16 splits incoming signal 14 into two substantially equal amplitude RF signals 18, 20 which have approximately a relative phase displacement of 180°. Signal 18 is sent to port 23 of four port mixer element 19 and signal 20 is sent to port 28 of mixer element 19. Similarly, LO input 11 supplies LO signal 13 to balun transformer 17. Balun transformer 17 splits LO signal 13 into two substantially equal amplitude RF signals 21, 22 having approximately a 180° relative phase displacement. Signal 21 is sent to port 26 of four port mixer element 19 and signal 22 is sent to port 9 of four port mixer element 19.

The nonlinear current versus voltage characteristics of diodes 24, 25, 27, 29 cause signals to be created at frequencies in accordance with equations 1-3, which signals are coupled to IF port 15. Because balun transformers 16, 17 must be able to pass the RF, LO, and IF frequencies, the required bandwidth of the balun transformers is more difficult to realize.

Furthermore, balun transformers such as 16, 17 are generally most useful at frequencies below about one GigaHertz. This limits the frequency range over which prior art mixer apparatus 10 is useful. Alternatively, hybrid devices have been used instead of balun transformers to split signals into two substantially equal amplitude signals having a 180° relative phase difference. These 180° hybrids are typically achieved typically using lumped or semi-lumped networks of capacitors, inductors and resistors. Examples of lumped element hybrids are given in U.S. Pat. Nos. 4,992,761, 5,023,576 and 5,045,821 assigned to the assignee of the present invention. These hybrids have a number of disadvantages at frequencies above several GigaHertz which include excessively small component size and cross-coupling problems making prior art hybrids unsuitable in very high frequency monolithic applications unsuitable.

Alternatively, "magic-tees" have been used as balun transformers to split signals into two substantially equal amplitude signals having a 180° relative phase difference. Magic tees are typically implemented in waveguide form and provide improved isolation between the output ports and between the input ports. The improved isolation is desirable for mixer applications, for example where the RF and LO frequency bands overlap. These waveguide devices are well known in the art.

Mixers are alternatively employed for modulation of an LO signal by an IF signal to produce a modulated carrier, or RF signal. This process is similar to the demodulation process described above, with LO port 11 and IF port 15 accepting input signals and RF port 12 providing an output signal.

Prior art mixers have a number of disadvantages well known in the art. Among these disadvantages are, for example: (1) inadequate port-to-port isolation, (2) limited bandwidth, particularly intermediate frequency bandwidth, (3) relative complexity and (4) difficulty of implementation in compact form suitable for incorporation in monolithic microwave integrated circuits (MMIC's).

MMIC's are typically constructed using Si, GaAs, or other compound or elemental semiconductor integrated circuit (IC) wafer processing technology on and/or in such wafers. It is highly desirable to have broadband mixers which can be made with lumped elements or other structures that are compatible with IC fabrication techniques and geometries. In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC.

Such concerns are important in the frequency range above one GigaHertz and especially important from about 20 to 40 GigaHertz and above where the sizes of distributed circuit elements are unwieldy. In particular, for broad-band applications, the use of hybrids or baluns requires many lumped or distributed elements which, in monolithic applications, require substantial die area. In order to achieve octave and multi-octave bandwidths, for example, several lumped element baluns must be cascaded together resulting in many components which is a major disadvantage since the die area is at a premium. Further, interactive coupling between the components may result from the additional elements in a small area degrading mixer performance.

Where high isolation between ports is additionally required in a mixer application, Magic-tee devices are not readily implementable in monolithic form because of their traditional waveguide construction, for example. Thus there is a need for mixers with the high isolation characteristics of Magic-tee signal inputs that are readily integratable in monolithic form.

Further, there continues to be a need for improved broadband mixers and methods of mixing signals that use fewer components, especially those which are easy to construct and/or which employ elements that are readily integratable in and/or on MMIC's or the like.

SUMMARY OF THE INVENTION

Accordingly, there is provided an apparatus for mixing high frequency electrical signals comprising a phase shifter for splitting a first input electrical signal of at least a first frequency and providing first and second intermediate signals at the first frequency at first and second outputs, respectively, the first and second intermediate signals separated in phase by approximately 180 degrees. The apparatus further comprises a signal divider for splitting a second input electrical signal of at least a second frequency and providing third and fourth intermediate signals at the second frequency at third and fourth outputs, respectively, a mixing element coupled to the phase shifter and the signal divider for mixing the first and second intermediate signals with the third and fourth intermediate signals, the mixing element producing at least fifth and sixth intermediate signals of at least a third frequency, and is comprised of semiconductor devices operating in a non-linear mode. The apparatus further comprises a signal combiner coupled to the mixing element for combining the fifth and sixth intermediate signals to produce an output IF signal of the at least third frequency.

In a preferred embodiment the apparatus comprises a phase shifter which comprises a coupler for producing a first and second coupled signal of the first frequency, the coupler having a first and second coupled outputs and a first transmission line having an electrical length of approximately one-half wavelength of the first frequency for receiving the first coupled signal. The phase shifter further comprises a second transmission line having an electrical length of approximately one-quarter wavelength of the first frequency for receiving the second coupled signal. The phase shifter further comprises a capacitor coupled in series between the second transmission line and the second coupled output of the coupler and the first and second transmission lines providing the first and second intermediate signals at the first frequency having substantially equal amplitude and separated in phase by substantially 180 degrees.

The present invention further provides a method for mixing a first input signal having at least a first frequency with a second input signal of at least a second frequency to form a third signal of at least a third frequency comprising the steps of coupling the first input signal to an input phase shifter having first and second output ports, to provide first and second intermediate signals differing in phase by approximately 180 degrees. The method further includes coupling the second input signal to a signal splitter having third and fourth output ports, to provide third and fourth intermediate signals and supplying the first and second intermediate signals and the third and forth intermediate signals to a mixing element.

In a preferred embodiment, the method further comprising the steps of extracting an IF signal pair from the mixing element and combining the IF signal pair to form a composite IF output signal.

In another preferred embodiment, the method further comprises the steps of coupling the first input signal to a signal coupler to provide first and second split signals, the first and second split signals being separated in phase by approximately 90 degrees and coupling the first split signal to a first transmission line having an electrical length of approximately one-half wavelength of the first frequency, the first transmission line providing the first intermediate signal. The method further comprises coupling the second split signal to a capacitor coupled in series between the signal coupler and a second transmission line, the second transmission line having an electrical length of approximately one-quarter wavelength of the first frequency and providing the second intermediate signal, the first and second intermediate signals being at the first frequency and having substantially equal amplitude and separated in phase by approximately 180 degrees.

The invention also provides a planar magic tee comprising a coupler for splitting an input electrical signal of a first frequency and providing first and second intermediate signals at first and second coupled outputs, respectively, the first and second intermediate signals separated in phase by approximately 90 degrees. The planar magic tee further comprises a first transmission line coupled to the first coupled output having a length of substantially one-half wavelength of the first frequency for receiving the first intermediate signal, a second transmission line coupled to the second coupled output having an electrical length of substantially one-quarter wavelength of the first frequency for receiving the second intermediate signal and a capacitor coupled in series between the second transmission line and the second coupled output of the coupler, the first and second transmission lines providing first and second output signals having substantially equal amplitude and separated in phase by approximately 180 degrees.

In a preferred embodiment the planar magic tee additionally comprises a dielectric substrate supporting conductor material and a ground plane situated in parallel to the dielectric substrate, the substrate chosen from high loss dielectric materials, the conductor material and ground planes fabricated by MMIC processes.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

Figure 1:
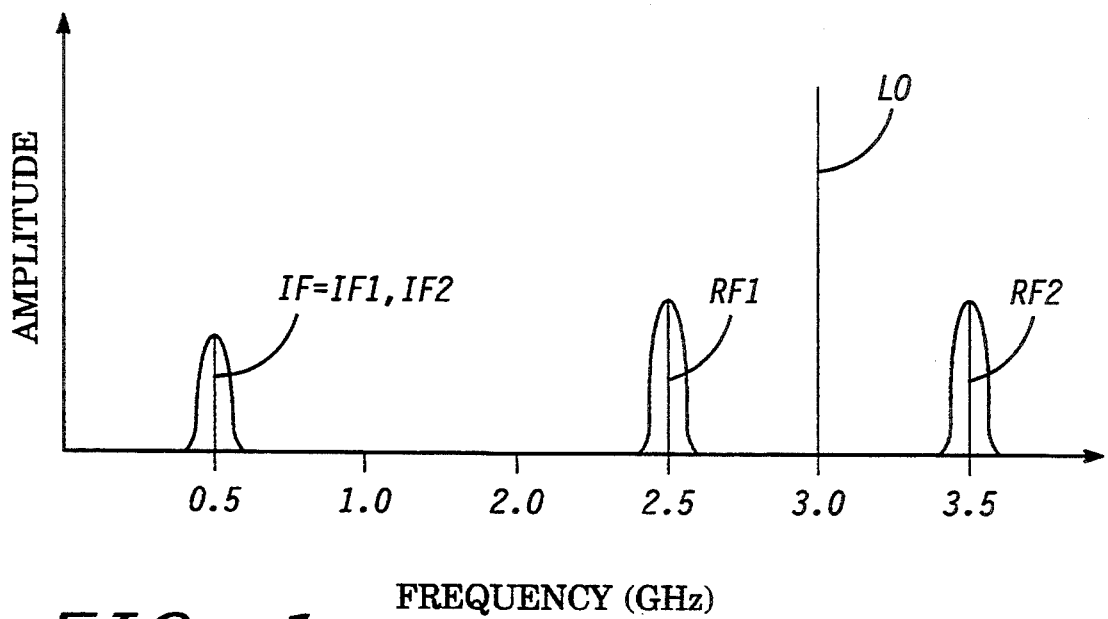
FIG. 1 is a simplified representation of RF, LO, and IF signals of different frequencies showing how RF signals RF1, RF2 are related in frequency to IF signals IF1, IF2.
Figure 2:
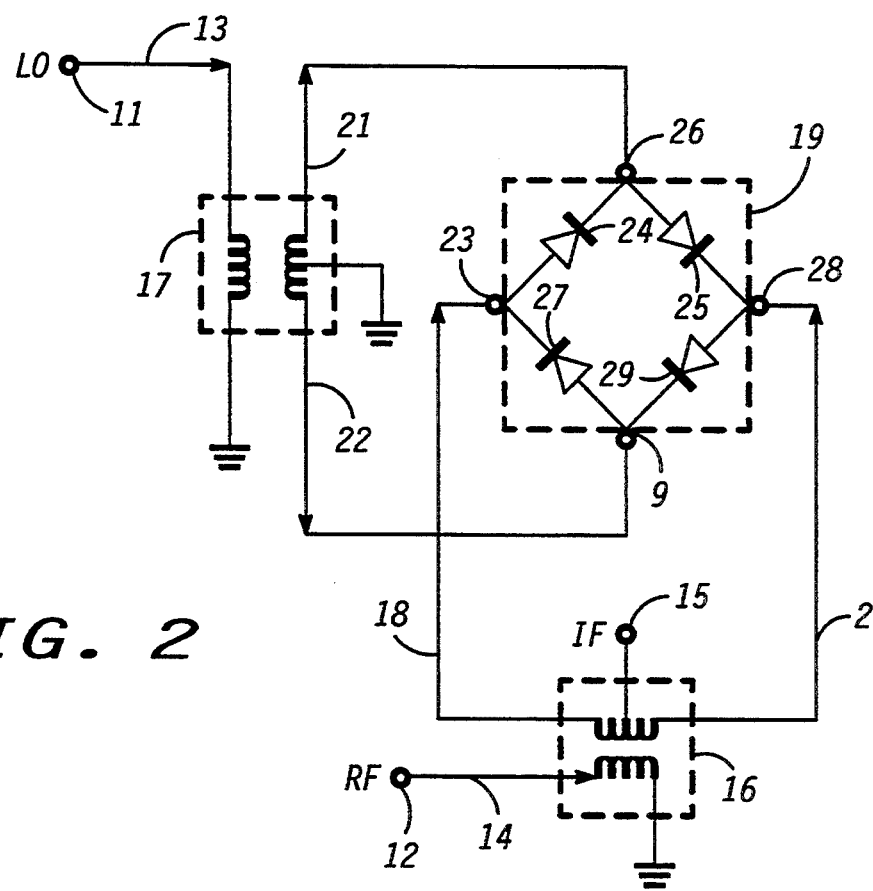
FIG. 2 is a simplified schematic representation of a double balanced mixer apparatus, according to the prior art.
Figure 3:
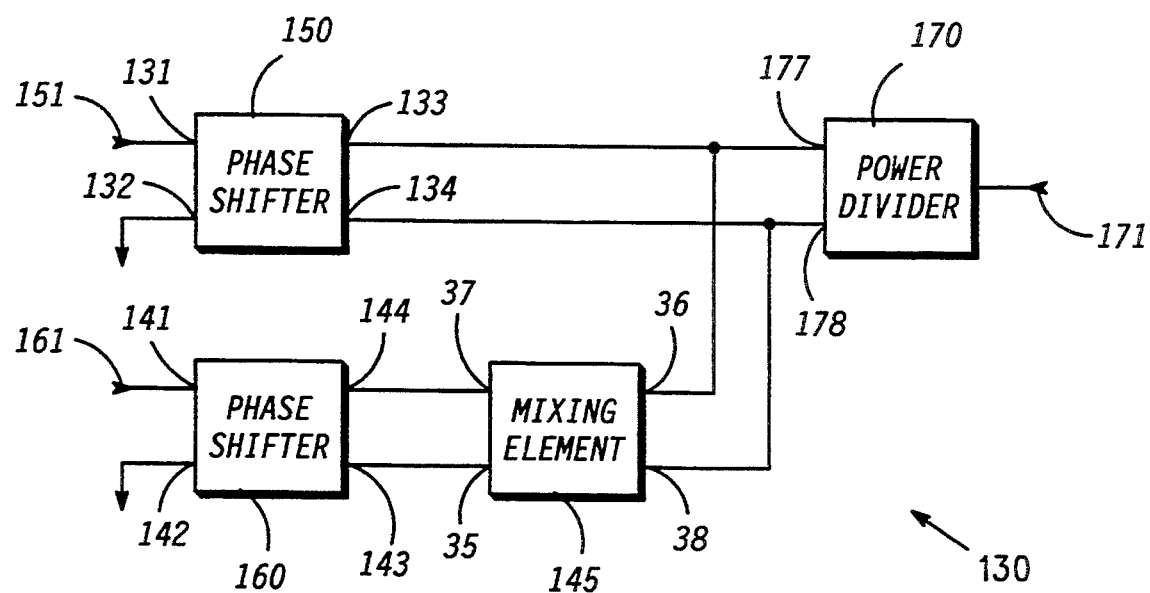
FIG. 3 shows a functional block diagram of a double balanced mixer according to a preferred embodiment of the present invention.

FIG. 3 shows a functional block diagram of planar magic-tee double balanced mixer 130 according to a preferred embodiment of the present invention. Mixer 130 comprises phase shifters 150, 160, power divider 170 and mixing element 145. Mixer 130 has RF signal port 151, LO signal port 161 and IF signal port 171. For convenience of explanation, the circuit is described in the case of port 151 receiving an RF signal and port 161 receiving the LO signal, but the RF and LO signals may be interchanged and the apparatus will function substantially the same way. Further, the circuit is described with port 171 as the IF signal output port, and port 151 as the RF input port, but port 151 may instead be the IF output port and port 171 may instead be the RF input port and the circuit will function substantially the same way.

RF signal at port 151 is coupled to node 131 of phase shifter 150 which provides substantially equal amplitude RF signals at nodes 133, 134 differing in phase by substantially 180°. LO signal at port 161 is coupled to node 141 of phase shifter 160 which provides substantially equal amplitude LO signals at nodes 143, 144 differing in phase by substantially 180°. Output signal pairs at nodes 133, 134 and nodes 143, 144 are coupled to nodes 136, 138 and nodes 135, 137, respectively, of mixing element 145. IF signal pairs generated in mixing element 145 are coupled from nodes 136, 138 of mixing element 145 to nodes 177, 178 of power divider 170 where combined to form a composite IF output signal at node 176. The composite IF output signal is coupled to IF output port 171.

Figure 4:
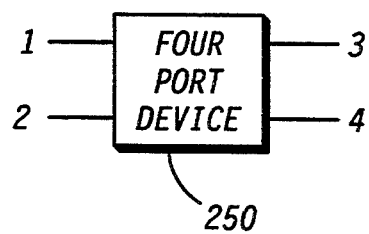
FIG. 4 shows a block diagram of a four port phase shifter.

Phase shifters 150 and 160 desirably have the properties of four-port device 250 shown in FIG. 4. These properties include substantially equal amplitude output signals at ports 3 and 4 for an input signal at either port 1 or 2; a relative phase difference of signals at ports 3 and 4 for an input signal at ports 1 or 2; and isolation between ports 1 and 2 and ports 3 and 4. It is preferable that the ports are matched at 50 ohms.

Phase shifters 150, 160 is desirably operate over a wide frequency range, for example 12–42 GHz and provide isolation high isolation between ports 133 and 134 and ports 143 and 144 to allow for overlap of the IF and LO frequency bands. For example, the isolation between ports 130 and 134 is at least 15 dB and desirably 20 dB and preferably 30 dB.

For example, port 171 of mixer 130 desirably operates at a frequency range from 2 to 12 GHz, and port 151 may desirably operate at a frequency range from 22 to 30 GHz, while port 161 operates in the frequency range of 28 to 40 GHz. Although the frequency ranges of ports 171 and 151 overlap, there is sufficient isolation due to the function of phase shifters 150, 160 used to impress and extract the necessary signals on mixing element 145.

Figure 5:
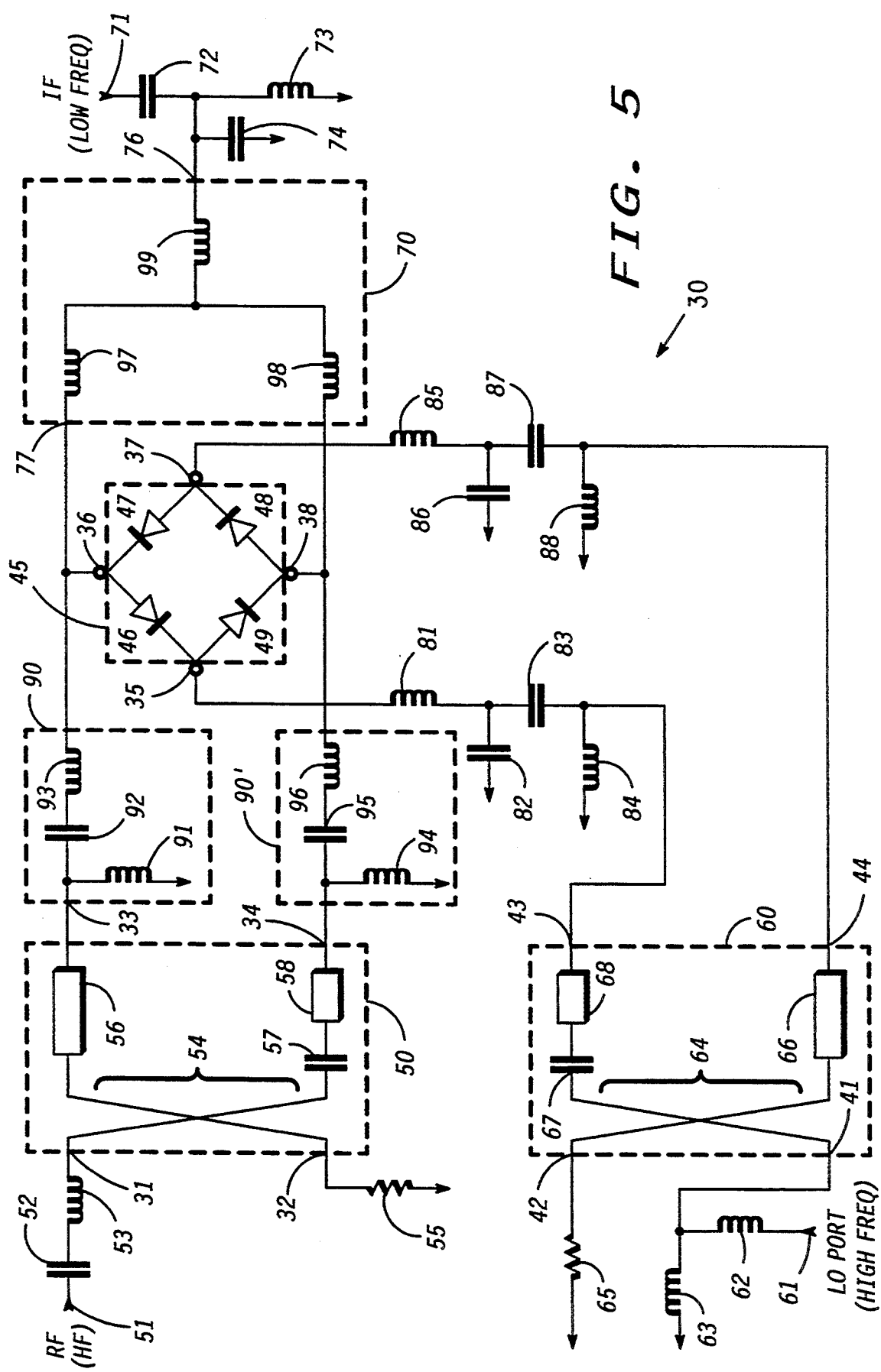
FIG. 5 shows a functional diagram of a double balanced mixer according to a preferred embodiment of the present invention.

FIG. 5 shows a block diagram of planar magic-tee double balanced mixer 30 according to a preferred embodiment of the present invention. Mixer 30 comprises phase shifters 50, 60, power divider 70, and mixing element 45. Mixer 30 has RF signal port 51, LO signal port 61 and IF signal port 71. Mixer 30 operates similarly to mixer 130 as described in FIG. 3 with phase shifters 50, 60 corresponding to phase shifters 150, 160 respectively, power divider 70 corresponding to power divider 170 and mixing element 45 corresponding to mixing element 145. Mixer 30 also includes matching circuitry 90, 90' and 80, 80'.

Phase shifter 50 desirably comprises coupler 54, capacitor 57 and transmission lines 56, 58. Coupler 54 provides substantially equal amplitude signals having a relative phase difference of 90° to transmission line 56 and capacitor 57. Coupler 54 is preferably a Lange coupler well know in the art and suitable for MMIC implementation. The length of transmission line 56 is desirably approximately one half-wavelength of the RF center frequency band of which mixer 30 is designed to operate. The length of transmission line 58 is desirably approximately one quarter-wavelength of the RF center frequency. Transmission lines 56, 58 and capacitor 57 provide substantially an additional 90° of phase shift to signals from coupler 54. Transmission lines 56, 58 are desirably fabricated in planar form, and preferably implemented in monolithic integrated circuit form. The total phase shift of phase shifter 50 would be the phase shift of coupler 54 and transmission lines 56, 58 totalling substantially 180°.

The operation of phase shifter 150 can be explained by considering the intermodal dispersion that a microwave signal experiences as it travels down transmission lines, which spreads the content of the original signal. The bandwidth of a transmission line is related to the length of the transmission line as a function of wavelength. Because of this, transmission lines are relatively narrow in bandwidth. By placing unequal sections of transmission lines one each leg of a Lange coupler (for example coupler 54), the effective dispersion difference between the outputs is greatly reduced while yielding some of the desired phase separation across a relative large bandwidth. The remaining phase separation and bandwidth performance is obtained by employing series capacitor 57, resulting is a total of 180 degrees of total phase shift differential through the coupler 54, transmission lines 56, 58 and series capacitor 57, across a relatively wide bandwidth.

As a result, phase shifter 50 is more tolerate to process variations and will experience better yield when compared to lumped element MMIC fabricated hybrids.

Capacitor 57 is chosen to maintain the 180° relative phase difference of phase shifter 50. For a RF frequency between 10 and 50 GHz, capacitor is desirably between 0.01 and 0.50 pF, and preferably between 0.08 and 0.15 pF. Those of skill in the art will understand how to choose capacitor 57 and design transmission lines described herein.

Phase shifter 60 operates in a similar manner to phase shifter 50 previously described and contains similar components frequency scaled for the desired frequency range of the LO port. Phase shifter 60 provides output signal pairs at nodes 43, 44 having a relative phase difference of 180° and substantially equal amplitude.

Mixing element 45 may be any non-linear element or combination of elements operated in a non-linear mode. Although other types of non-linear elements or combinations of elements may be used for mixing element 45, a ring of diodes is desirable. In a preferred embodiment, mixing element 45 is comprised of matched diodes fabricated from a single semiconductor die or die lot and preferably constructed using monolithic fabrication techniques. The diodes are desirably schottky barrier Pseudomorphic-High Electron Mobility junctions optimized for transistor operation (P-HEMT) and preferably low voltage band gap devices constructed using monolithic fabrication techniques. The advantage of the P-HEMT diodes primarily lies with the conversion efficiency which directly relates to the series resistance of the junction. In addition, P-HEMT MMIC processing facilitates a higher frequency of operation due to it's higher process cutoff frequency, fc. In FIG. 5, although a ring quad of diodes is shown, those of skill in the art will recognize that other topologies may be chosen. For example, diodes may be configured in a star configuration which is well known in the art. Further, in FIG. 3, diodes are show for mixing element 45 only for illustrative purposes only and is not meant to be limiting it any way. For example, field effect transistors operated in a non-linear mode are also suitable for use in mixing element 45.

Due to the non-linear conduction properties of mixing element 45, the LO and RF signals at nodes 35, 37 and 36, 58 are mixed resulting in the generation of IF signal pairs at nodes 35, 36, 37 and 38 of mixing element 45. The IF signals can be extracted from opposing nodes, for example nodes 36, 38 or nodes 35, 37 and are coupled to nodes 77, 78 of power divider 70.

Power divider 70 combines the IF signal pairs from nodes 36, 38, for example of mixing element 45, producing a composite IF signal at node 76 from which the composite IF signal is coupled to output port 71 of mixer 30. In the embodiment described, power divider 70 operates as a power combiner where the IF signal pairs from mixing element 45 are combined to form a composite IF signal. However, power divider 70 can also operate as a signal or power divider where port 71 is an input port and either port 51 or port 61 is operated as an output port.

Power divider 70 can be any three port element or combination of elements that can provide in-phase signal division or signal combining. Power divider 70 is desirably a Wilkenson type power divider well known to those of skill in the art. Power divider 70 preferably is suitable for fabrication in monolithic form and optimized for the IF frequency range of interest. In a preferred embodiment, power divider 70 is designed for the L and X-band ranges and desirably operates from 2 to 12 GHz.

Mixer 30 desirably is fabricated on a single MMIC die. In the case where the RF and LO frequency range is between 20 and 40 GHz and the IF frequency range is between 2 and 12 GHz, mixer 30 can be fabricated on a die size, for example, of approximately 1.54 by 3.1 millimeters (60 by 120 thousands of an inch) while allowing sufficient spacing between components to minimize interactive coupling.

Matching circuits 90, 90' are desirably included in mixer 30 and may include capacitors 92, 95 and inductors 91, 93, 94, 96 are included in-between nodes 33, 34 of phase shifter 50 and nodes 36, 38 of mixing element 45 to provide impedance matching and improve the conversion efficiency of mixer 30. In a preferred embodiment, matching circuits 90, 90' are substantially identical and fabricated on the same semiconductor die. Capacitors 92, 95 and inductors 91, 93, 94, 96 are chosen to improve conversion efficiency. Those of skill in the art will understand how to choose matching circuits 90, 90'.

Thus, a double balanced mixer using planar magic-tees has been described which overcomes MMIC size limitations and provides high isolation between ports where frequency band overlap. The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An apparatus for mixing high frequency electrical signals comprising:

a phase shifter for splitting a first input electrical signal of at least a first frequency and providing first and second intermediate signals at said first frequency at first and second outputs, respectively, said first and second intermediate signals separated in phase by approximately 180 degrees;

a signal divider for splitting a second input electrical signal of at least a second frequency and providing third and fourth intermediate signals at said second frequency at third and fourth outputs, respectively;

a mixing element coupled to said phase shifter and said signal divider for mixing said first and second intermediate signals with said third and fourth intermediate signals; said mixing element producing at least fifth and sixth intermediate signals of at least a third frequency, said mixing element comprised of semiconductor devices and operated in a non-linear mode; and a signal combiner coupled to said mixing element for combining said fifth and sixth intermediate signals to produce an output IF signal of said at least third frequency, and wherein said phase shifter comprises:

a coupler for producing a first and second coupled signal of said first frequency, said coupler having a first and second coupled outputs;

a first transmission line having an electrical length of approximately one-half wavelength of said first frequency for receiving said first coupled signal;

a second transmission line having an electrical length of approximately one-quarter wavelength of said first frequency for receiving said second coupled signal;

a capacitor coupled in series between said second transmission line and said second coupled output of said coupler; and said first and second transmission lines providing said first and second intermediate signals at said first frequency having substantially equal amplitude and separated in phase by substantially 180 degrees.

2. An apparatus as claimed in claim 1 wherein said signal divider provides said third and fourth intermediate signals, said third and fourth intermediate signals having approximately zero degrees of relative phase difference at said third and fourth outputs; and said signal combiner combines said fifth and sixth intermediate signals 180 degrees out of phase to produce said output IF signal.

3. An apparatus as claimed in claim 2 wherein said first frequency is between 22 and 30 giga-hertz (GHz), said second frequency is between 2 and 12 giga-hertz (GHz), and said third frequency is between 28 and 40 giga-hertz (GHz).

4. An apparatus as claimed in claim 1 wherein said mixing element comprises diodes in a ring configuration.

5. An apparatus as claimed in claim 4 wherein said diodes are matched diodes fabricated from a single semiconductor die or die lot.

6. An apparatus as claimed in claim 5 wherein said diodes are schottky barrier Pseudomorphic-High Electron Mobility junctions optimized for transistor operation (P-HEMT).

7. An apparatus as claimed in claim 5 wherein said diodes are fabricated on a monolithic microwave integrated circuit.

8. An apparatus as claimed in claim 1 wherein said mixing element comprises diodes in a star configuration.

9. An apparatus as claimed in claim 1 wherein said mixing element is comprised of field effect transistors (FETs) operated in a nonlinear mode.

10. An apparatus as claimed in claim 1 wherein said first and second transmission lines comprise conductor material, and said apparatus additionally comprises:

a dielectric substrate having first and second opposite sides, said first opposite side supporting said conductor material; and a ground plane situated in parallel to said dielectric substrate and coupled to said second opposite side, said dielectric substrate chosen from high loss dielectric materials, said conductor material and ground plane fabricated by monolithic microwave integrated circuit (MMIC) processes.

11. An apparatus for mixing high frequency electrical signals comprising:

a phase shifter for splitting a first input electrical signal of at least a first frequency and providing first and second intermediate signals at said first frequency at first and second outputs, respectively, said first and second intermediate signals separated in phase by approximately 180 degrees;

a signal divider for splitting a second input electrical signal of at least a second frequency and providing third and fourth intermediate signals at said second frequency at third and fourth outputs, respectively;

a mixing element coupled to said phase shifter and said signal divider for mixing said first and second intermediate signals with said third and fourth intermediate signals; said mixing element producing at least fifth and sixth intermediate signals of at least a third frequency, said mixing element comprised of semiconductor devices and operated in a non-linear mode; and a signal combiner coupled to said mixing element for combining said fifth and sixth intermediate signals to produce an output IF signal of said at least third frequency, and wherein said signal divider provides said third and fourth intermediate signals, said third and fourth intermediate signals separated in phase by approximately 180 degrees at said third and fourth outputs; and said signal combiner combines said fifth and sixth intermediate signals in phase to produce said output IF signal.

12. An apparatus as claimed in claim 11 wherein said signal divider comprises:

a coupler for producing a first and second coupled signal of said second frequency, said coupler having a first and second coupled outputs;

a first transmission line having a length of approximately one-half wavelength of said second frequency for receiving said first coupled signal;

a second transmission line having an electrical length of approximately one-quarter wavelength of said second frequency for receiving said second coupled signal;

a capacitor coupled in series between said second transmission line and said second coupled output of said coupler; and said first and second transmission lines providing said third and fourth intermediate signals at said second frequency having substantially equal amplitude and separated in phase by substantially 180 degrees.

13. An apparatus as claimed in claim 11 wherein said first frequency is between 22 and 30 giga-hertz (GHz), said second frequency is between 28 and 40 giga-hertz (GHz), and said third frequency is between 2 and 12 giga-hertz (GHz).

14. An apparatus for mixing high frequency electrical signals comprising:

a phase shifter for splitting a first input electrical signal of at least a first frequency and providing first and second intermediate signals at said first frequency at first and second outputs, respectively, said first and second intermediate signals separated in phase by approximately 180 degrees;

a signal divider for splitting a second input electrical signal of at least a second frequency and providing third and fourth intermediate signals at said second frequency at third and fourth outputs, respectively;

a mixing element coupled to said phase shifter and said signal divider for mixing said first and second intermediate signals with said third and fourth intermediate signals; said mixing element producing at least fifth and sixth intermediate signals of at least a third frequency, said mixing element comprised of semiconductor devices and operated in a non-linear mode; and a signal combiner coupled to said mixing element for combining said fifth and sixth intermediate signals to produce an output IF signal of said at least third frequency, and wherein said signal divider provides said third and fourth intermediate signals, said third and fourth intermediate signals having approximately zero degrees of relative phase difference at said third and fourth outputs; and said signal combiner combines said fifth and sixth intermediate signals 180 degrees out of phase to produce said output IF signal, and wherein said signal combiner comprises:

a first transmission line coupled to said mixing element having a length of approximately one-half wavelength of said second frequency for receiving said fifth intermediate signal, said first transmission line producing a first coupled signal of said at least third frequency;

a second transmission line coupled to said mixing element having an electrical length of approximately one-quarter wavelength of said second frequency for receiving said sixth intermediate signal, said second transmission line producing a second coupled signal of said at least third frequency;

a coupler for combining said first and second coupled signals, said coupler having a first and second coupled inputs coupled to said first and said second transmission lines respectively;

a capacitor coupled in series between said second transmission line and said second coupled output of said coupler; and said coupler providing said output IF signal at said at least third frequency.

15. A method for mixing a first input signal having at least a first frequency with a second input signal of at least a second frequency to form a third signal of at least a third frequency comprising the steps of:

coupling said first input signal to an input phase shifter having first and second output ports, to provide first and second intermediate signals differing in phase by approximately 180 degrees;

coupling said second input signal to a signal splitter having third and fourth output ports, to provide third and fourth intermediate signals;

supplying said first and second intermediate signals and said third and forth intermediate signals to a mixing element, and wherein said coupling said first input signal step further comprises the steps of:

coupling said first input signal to a signal coupler to provide first and second split signals, said first and second split signals being separated in phase by approximately 90 degrees;

coupling said first split signal to a first transmission line having an electrical length of approximately one-half wavelength of said first frequency, said first transmission line providing said first intermediate signal; and coupling said second split signal to a capacitor coupled in series between said signal coupler and a second transmission line, said second transmission line having an electrical length of approximately one-quarter wavelength of said first frequency and providing said second intermediate signal, said first and second intermediate signals being at said first frequency and having substantially equal amplitude and separated in phase by approximately 180 degrees.

16. A method as claimed in claim 15 wherein said supplying step comprises supplying said first and second intermediate signals to first and second ports of said mixing element, and supplying said third and fourth intermediate signals to third and fourth ports of said mixing element, said mixing element comprising diodes in a ring configuration.

17. A method as claimed in claim 15 wherein said supplying step comprises supplying said first, second, third and fourth intermediate signals to said mixing element, said mixing element comprised of diodes in a ring configuration, said diodes being matched diodes fabricated from a single semiconductor die or die lot.

18. A method as claimed in claim 15 wherein said supplying step comprises supplying said first, second, third and fourth intermediate signals to said mixing element, said mixing element comprised of diodes having schottky barrier Pseudomorphic-High Electron Mobility junctions optimized for transistor operation (P-HEMT).

19. A method as claimed in claim 15 wherein said supplying step comprises supplying said first, second, third and fourth intermediate signals to said mixing element, said mixing element comprised of diodes fabricated on a monolithic microwave integrated circuit.

20. A method as claimed in claim 15 wherein said supplying step comprises supplying said first, second, third and fourth intermediate signals to said mixing element, said mixing element comprised of field effect transistors (FETs) operated in a non-linear mode.

21. A method for mixing a first input signal having at least a first frequency with a second input signal of at least a second frequency to form a third signal of at least a third frequency comprising the steps of:

coupling said first input signal to an input phase shifter having first and second output ports, to provide first and second intermediate signals differing in phase by approximately 180 degrees;

coupling said second input signal to a signal splitter having third and fourth output ports, to provide third and fourth intermediate signals;

supplying said first and second intermediate signals and said third and forth intermediate signals to a mixing element;

extracting a first portion of an IF signal pair from one port of said mixing element, and a second portion of said IF signal pair from another port of said mixing element; and combining said first and second portions of said IF signal pair to form a composite IF output signal, said third signal being comprised of said composite IF output signal, and wherein said third and fourth intermediate signals are approximately 180 degrees out of phase and in said combining step, said IF signal pair is combined in phase in a signal combiner.

22. A method as claimed in claim 21 wherein the coupling said second input signal step further comprises the steps of:

coupling said second input signal to a signal coupler to provide first and second split signals, said first and second split signals being separated in phase by approximately 90 degrees;

coupling said first split signal to a first transmission line having an electrical length of approximately one-half wavelength of said second frequency, said first transmission line providing said third intermediate signal; and coupling said second split signal to a capacitor coupled in series between said signal coupler and a second transmission line, said second transmission line having an electrical length of approximately one-quarter wavelength of said second frequency and providing said fourth intermediate signal, said third and fourth intermediate signals being at said second frequency and having substantially equal amplitude and separated in phase by approximately 180 degrees.

23. A method for mixing a first input signal having at least a first frequency with a second input signal of at least a second frequency to form a third signal of at least a third frequency comprising the steps of:

coupling said first input signal to an input phase shifter having first and second output ports, to provide first and second intermediate signals differing in phase by approximately 180 degrees;

coupling said second input signal to a signal splitter having third and fourth output ports, to provide third and fourth intermediate signals;

supplying said first and second intermediate signals and said third and forth intermediate signals to a mixing element;

extracting a first portion of an IF signal pair from one port of said mixing element, and a second portion of said IF signal pair from another port of said mixing element; and combining said first and second portions of said IF signal pair to form a composite IF output signal, said third signal being comprised of said composite IF output signal, and wherein said third and fourth intermediate signals are approximately in phase and in said combining step, said IF signal pair is combined 180 degrees out of phase in an output phase shifter, and wherein combining said IF signal pair step further comprises the steps of:

coupling said IF signal pair to first and second transmission lines, said first transmission line having an electrical length of approximately one-half wavelength of said third frequency and providing a first split signal, said second transmission line having an electrical length of approximately one-quarter wavelength of said third frequency and providing a second split signal;

coupling said first split signal to a first node of a signal combiner, said first node coupled to said first; transmission ling; and coupling said second split signal to a capacitor coupled in series between a second node of said signal combiner and said second transmission line;

combining said first and second split signals 90 degrees out of phase in said signal combiner to produce said composite IF output signal, and wherein said output phase shifter comprises said first and second transmission lines, said signal combiner, and said capacitor.

24. A planar magic tee comprising:

a coupler for splitting an input electrical signal of a first frequency and providing first and second intermediate signals at first and second coupled outputs, respectively, said first and second intermediate signals separated in phase by approximately 90 degrees;

a first transmission line coupled to said first coupled output having a length of approximately one-half wavelength of said first frequency for receiving said first intermediate signal;

a second transmission line coupled to said second coupled output having an electrical length of approximately one-quarter wavelength of said first frequency for receiving said second intermediate signal; and a capacitor coupled in series between said second transmission line and said second coupled output of said coupler, said first and second transmission lines providing first and second output signals, respectively, having substantially equal amplitude and separated in phase by approximately 180 degrees.

25. An planar magic tee as claimed in claim 24 wherein said first and second transmission lines comprise conductor material, and said planar magic tee additionally comprises:

a dielectric substrate having first and second opposite sides, said first opposite side supporting said conductor material and;

a ground plane situated in parallel to said dielectric substrate and coupled to said second opposite side, said substrate chosen from high loss dielectric materials, said conductor material and ground plane fabricated by monolithic microwave integrated circuit (MMIC) processes.

* * * * *

UNITED STATES PATENT AND TRADEMARK OFFICE
CERTIFICATE OF CORRECTION

PATENT NO. : 5,428,839
DATED : June 27, 1995
INVENTOR(S) : Michael James Friesen
Benny Wayne Lowe It is certified that error appears in the above-indentified patent and that said Letters Patent is hereby corrected as shown below:

In Claim 23, column 13, line 38, replace "first;" with --first--.

In Claim 23, column 13, line 39, replace "ling" with --line--.

Signed and Sealed this

Twenty-seventh Day of February, 1996

Attest:

BRUCE LEHMAN

*Attesting Officer*          *Commissioner of Patents and Trademarks*